(12) United States Patent
Van Slyke et al.

(10) Patent No.: US 6,348,359 B1
(45) Date of Patent: Feb. 19, 2002

(54) CATHODE CONTACT STRUCTURES IN ORGANIC ELECTROLUMINESCENT DEVICES

(75) Inventors: Steven A. Van Slyke, Pittsford; Ching W. Tang, Rochester, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/667,953

(22) Filed: Sep. 22, 2000

(51) Int. Cl.[7] .............................................. H01L 21/00
(52) U.S. Cl. ............................. 438/29; 438/69; 438/70; 313/504
(58) Field of Search ............................ 438/34, 69, 52, 438/70, 29; 313/504

(56) References Cited

U.S. PATENT DOCUMENTS

| | | | |
|---|---|---|---|
| 5,276,380 A | 1/1994 | Tang | |
| 5,294,870 A | * 3/1994 | Tang et al. | 315/169.3 |
| 5,550,066 A | 8/1996 | Tang et al. | |
| 5,701,055 A | 12/1997 | Nagayama et al. | |
| 6,037,712 A | * 3/2000 | Codama et al. | 313/498 |

* cited by examiner

*Primary Examiner*—Long Pham
(74) *Attorney, Agent, or Firm*—Raymond L. Owens

(57) ABSTRACT

Passive matrix and active matrix organic electroluminescent (EL) devices are fabricated by using a single mask which defines a deposition zone for depositing an organic EL medium layer and a cathode by directing respective vapor streams towards a substrate in the deposition zone. Electrically insulative organic shadowing structures are formed over cathode connectors for providing electrical contact between a cathode and a cathode connector in a position where the organic EL medium layer is spaced from a base of a shadowing structure. The electrical contact is achieved by directing an organic EL materials vapor stream towards the substrate in a direction substantially perpendicular to the substrate, and by directing a cathode materials vapor stream towards the substrate under a subtended angle.

19 Claims, 14 Drawing Sheets

CATHODE CONTACT STRUCTURES IN ORGANIC ELECTROLUMINESCENT DEVICES

CROSS REFERENCE TO RELATED APPLICATIONS

Reference is made to commonly assigned U.S. patent application Ser. No. 09/667,293 filed concurrently herewith entitled "Organic Electroluminescent Device With Supplemental Cathode Bus Conductor" by Van Slyke, the disclosure of which is incorporated herein by reference.

FIELD OF THE INVENTION

The present invention relates generally to organic electroluminescent (EL) devices and more particularly to organic EL devices having contact structures which provide electrical contact between a cathode and a cathode connector of the device.

BACKGROUND OF THE INVENTION

Passive matrix organic EL devices are fabricated by sandwiching organic EL medium layers between patterned anodes and perpendicularly oriented cathodes. Although full-color passive matrix organic EL devices have been disclosed in U.S. Pat. 5,701,055, a potentially large market exists for monochrome and area-color organic EL devices. In order to meet with demands of this market in a competitive economic environment, methods of device manufacturing have to be found or improved so as to reduce manufacturing costs of such devices.

In a conventional pixelated organic EL device, light-transmissive anodes, for example indium-tin-oxide (ITO) anodes, are formed on a light-transmissive substrate such as, for example, a glass substrate. For relatively small devices, ITO can also be used to form anode and cathode connectors extending inwardly from edges of the substrate for providing electrical connections to driving circuitry to supply driving signals required for operating the organic EL device. For larger area devices, low-resistance metallic connectors are required, at least for the cathodes, to carry electrical currents from an active, pixelated device area to and from the driving circuitry.

Since an organic EL medium layer formed between the anodes and cathodes is relatively electrically insulative, two basic requirements must be met in making a conventional organic EL device: firstly, the organic EL medium layer must be formed, usually by vapor deposition, so that the layer will not cover the portions of the low-resistance metallic connectors which are needed for the electrical connections to the driving circuitry; and secondly, the organic EL medium layer must be formed so that no direct electrical contact between the anodes and the cathodes is possible, i.e. to avoid electrical shorts between the electrodes. In making conventional organic EL devices, these two requirements can be met by selecting a least two separate masking procedures, namely providing a first vapor deposition mask which defines a first deposition zone for forming a defined organic EL medium layer, and providing a second vapor deposition mask which defines a second deposition zone for forming a defined cathode or defined cathodes.

Because organic EL medium layers are sensitive to moisture under ambient conditions, a third requirement of manufacturing organic EL devices is the sequential formation of the organic EL medium layer(s) and the cathode(s) by sequential vapor deposition in a vacuum vapor deposition system without exposing the organic EL medium layer(s) to moisture levels which would prevail under atmospheric conditions outside the vacuum system. While the above first vapor deposition mask can be accurately positioned with respect to the substrate outside the vacuum system, i.e. prior to forming the organic EL medium layer(s), removal of the first mask and accurate positioning of the second mask with respect to the substrate and with respect to the organic EL medium layer(s) by manipulations inside the vacuum system is a relatively complex and time-consuming procedure and may result in misalignment errors.

SUMMARY OF THE INVENTION

It is an object of the present invention to provide a method of making an organic EL device by using a single deposition mask defining a deposition zone for vapor depositing an organic EL medium layer and a cathode and by forming a cathode connector shadowing structure for providing electrical contact between a cathode and a cathode connector.

This object is achieved in A method of making a pixelated organic electroluminescent (EL) device, comprising the steps of:

a) providing a light-transmissive substrate having a plurality of spaced light-transmissive anodes formed thereover and at least one cathode connector extending inwardly from an edge of the substrate for providing an electrical connection so that a drive voltage can be applied between a selected anode and at least one cathode to cause light emission from a pixel of the device formed by the selected anode and the at least one cathode;

b) forming an electrically insulative organic cathode connector shadowing structure over the at least one cathode connector;

c) providing a mask defining a deposition zone over the substrate for depositing an electrically insulative organic EL medium layer and a conductive cathode over the organic EL medium layer;

d) first depositing the organic EL medium layer by a vapor deposition of organic EL materials directed towards the substrate into the deposition zone and using a direction of vapor deposition with respect to the cathode connector shadowing structure to cause formation of the organic EL medium layer to terminate at a position spaced from a base of the at least one cathode connector shadowing structure; and e) second depositing the conductive cathode by a vapor deposition of conductive materials directed towards the organic EL medium layer into the deposition zone and using a direction of vapor deposition with respect to the cathode connector shadowing structure to cause formation of the conductive cathode over the organic EL medium layer, the conductive cathode terminating in electrical contact with the at least one cathode connector in a position where the organic EL medium layer is spaced from the base of the at least one cathode connector shadowing structure.

BRIEF DESCRIPTION OF THE DRAWINGS

FIGS. 1–7 depict schematically aspects of making a prior art pixelated organic electroluminescent (EL) device, in which FIG. 1 is a plan view of a substrate having a plurality of spaced anodes, cathode connectors, and cathode separation shadowing structures which extend in a direction perpendicular to the anodes;

FIG. 2 is a section view of the substrate taken along the section line 2—2 of FIG. 1;

FIG. 3 is a section view of the substrate taken along the section line 3—3 of FIG. 1;

FIG. 4 is a plan view of the substrate which has portions covered by a first mask defining a first deposition zone for depositing an organic EL medium layer on the substrate;

FIG. 5 is an enlarged section view of the substrate taken along the section line 5—5 of FIG. 4 and indicating portions of the organic EL medium layer formed by vapor deposition from a vapor stream which is incident on the substrate in the first deposition zone in a direction substantially perpendicular to the substrate;

FIG. 6 is a plan view of the substrate which has portions covered by a second mask defining a second deposition zone for depositing a conductive cathode over the organic EL medium layer and over portions of the cathode connectors such that the organic EL medium layer will protect the anodes from electrical contact with the cathode;

FIG. 7 is an enlarged section view taken along the section line 7—7 of FIG. 6 and showing a contact region formed between a cathode connector and a cathode, the cathode spaced from adjacent cathodes by the cathode separation shadowing structures which shadow a cathode materials vapor steam incident on the substrate in the second deposition zone in a direction substantially perpendicular to the substrate;

FIGS. 8–16 indicate schematically aspects of making a pixelated organic electroluminescent (EL) device in accordance with the present invention and having on a substrate a plurality of spaced anodes, cathode separation shadowing structures, and cathode connectors with each cathode connector having a cathode connector shadowing structure, in which FIG. 8 is a plan view of a substrate having a plurality of spaced anodes, cathode separation shadowing structures which extend in a direction perpendicular to the anodes, two boundary layers, and spaced cathode connectors with each cathode connector having a cathode connector shadowing structure;

FIG. 9 is an enlarged section view taken along the section line 9—9 of FIG. 8 and showing one of the boundary layers formed over the anodes and the substrate;

FIG. 10 is an enlarged section view taken along the section line 10—10 of FIG. 8 and showing a cathode connector shadowing structure formed over a cathode connector;

FIG. 11 is a plan view of the substrate which has portions covered by a mask defining a deposition zone for depositing an organic EL medium layer on the substrate and for depositing a cathode over the organic EL medium layer;

FIG. 12 is a section view of the substrate taken along the section line 12—12 of FIG. 11 in which the substrate is disposed within a mask frame structure which supports the mask;

FIG. 13 is a plan view of an organic EL device in which an organic EL medium layer and a cathode or cathodes have been formed over the substrate of FIG. 11 in the deposition zone;

FIG. 14 is an enlarged section view of a cathode connector and a cathode connector shadowing structure taken along the section line 14—14 of FIG. 13 and showing first (organic EL) and second (cathode) vapor depositions to form an organic EL medium layer and to form a cathode in electrical contact with a cathode connector;

FIG. 15 is a section view of a substrate disposed within a mask frame structure which supports a mask defining a larger deposition zone and an overlay mask defining a smaller overlay deposition zone for vapor depositing a first organic EL medium layer over a selected area of the substrate;

FIGS. 17–20 show schematically aspects of making an active matrix organic electroluminescent (EL) device, in which FIG. 17 is a schematic circuit diagram showing a plurality of addressable thin-film-transistor (TFT) organic EL pixels wherein each TFT pixel has an associated light-transmissive anode and a shared or common cathode;

FIG. 18 is a plan view of a substrate having a plurality of spaced TFT pixels, integrated x and y driver circuits, and a cathode connector having a plurality of cathode connector shadowing structures formed thereover;

FIG. 19 is a plan view of the active matrix organic EL device in which an organic EL medium layer and a cathode have been formed over the substrate of FIG. 18 in a deposition zone defined in a mask; and FIG. 20 is a section view of cathode connector shadowing structures formed over the cathode connector taken along the section line 20—20 in FIG. 19 and showing a first (organic EL) and a second (cathode) vapor deposition to form an organic EL medium layer and to form a cathode in electrical contact with the cathode connector at each of the shadowing structures.

The drawings are necessarily of a schematic nature since the thicknesses of individual layers are too thin, and thickness differences of the various elements too great, to permit depiction to scale or to permit convenient proportionate scaling. Additionally, for purposes of clarity, the drawings show a single organic electroluminescent (EL) medium layer which, in actual practice, can include several layers, for example organic hole-injecting and hole-transporting layers, an organic light-emitting layer which may emit light of a single color or hue ("monochrome" EL device), or which can emit one of red, green, or blue light as "area colors" by appropriate doping of an organic light-emitting host material with a selected organic luminescent dopant material, and an organic electron-transporting layer. Alternatively, the organic EL medium layer can include one or more organic polymeric layers.

DETAILED DESCRIPTION OF THE INVENTION

In order to more fully appreciate the invention, aspects of making a prior art pixelated organic electroluminescent (EL) device will be described with reference to FIGS. 1–7.

Figure 1:
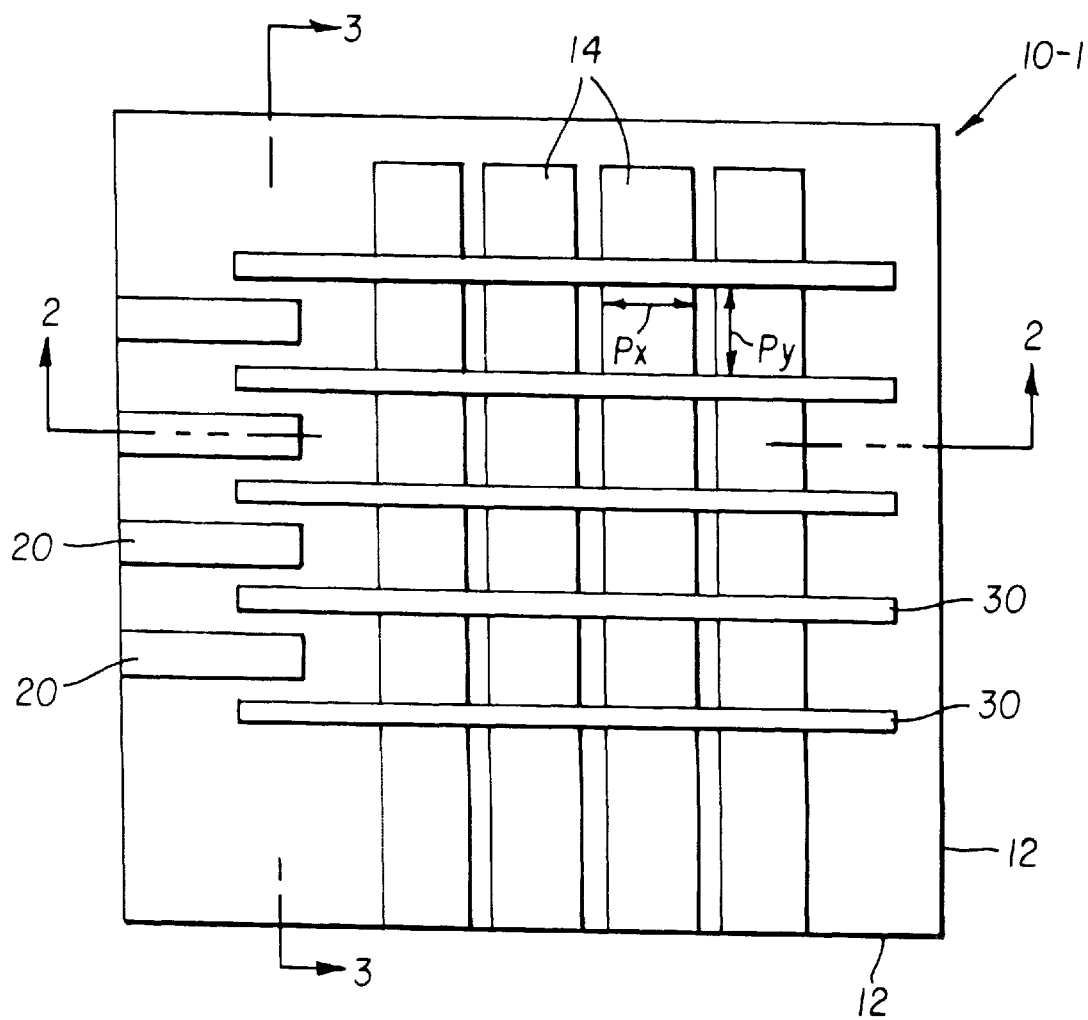

FIG. 1 is a plan view of a substrate configuration 10-1 which includes a light-transmissive substrate 12 having a plurality of spaced light-transmissive anodes 14 formed thereover, as well as a plurality of spaced cathode connectors 20 which extend inwardly from an edge of the substrate. A plurality of organic cathode separation shadowing structures 30 are formed over the anodes and portions of the substrate 12, and extending in a direction perpendicular to the anodes. The cathode separation shadowing structures 30 are electrically insulative, and serve to provide a plurality of spaced cathodes, each of which will be in electrical contact with a cathode connector 20. An active pixel dimension in an x-direction, $P_x$, and an active pixel direction in a y-direction, $P_y$, are indicated in FIG. 1.

The light-transmissive substrate 12 can be made of glass, quartz, suitable plastic materials, and the like. The anodes 14 are preferably made of indium-tin-oxide (ITO), and the cathode connectors 20 are preferably made from a low-resistance metal, for example, copper, aluminum, molybdenum, and the like.

Although not shown in the drawings, it will be understood that each of the anodes 14 can have a low-resistance metal connector pad formed thereover, and extending inwardly from an edge of the substrate 12, for example, from the lower edge depicted in FIG. 1.

Figure 2:
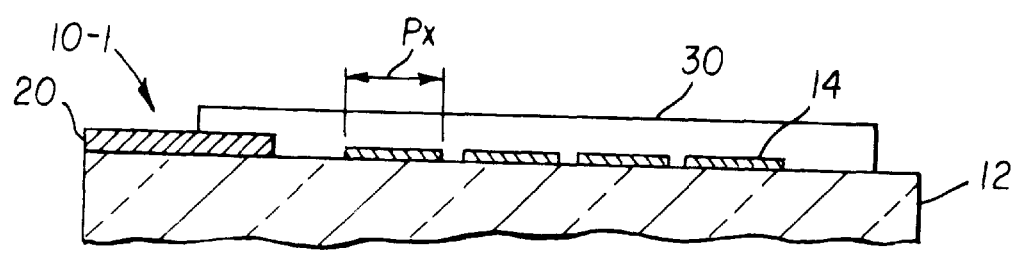

FIG. 2 is a section view of the configuration 10-1, taken along the section line 2—2 of FIG. 1, and showing a cathode separation shadowing structure 30 in the background.

Figure 3:
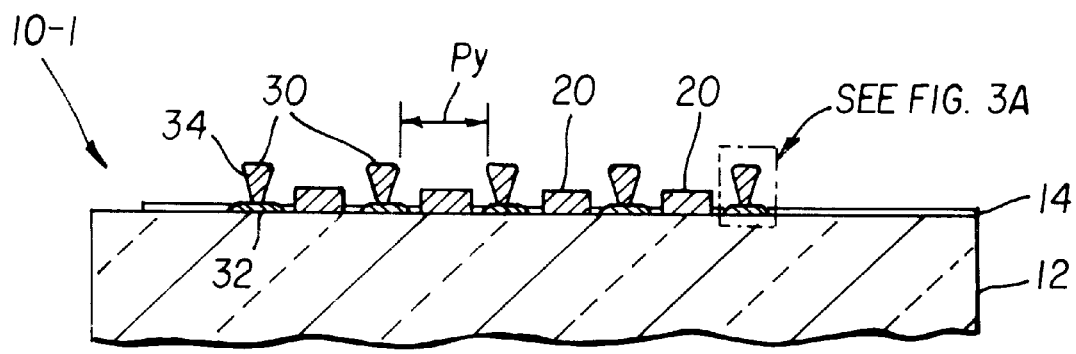

FIG. 3 is a section view of the configuration 10-1, taken along the section line 3—3 of FIG. 1, and showing the cathode connectors 20 positioned between two adjacent cathode separation shadowing structures 30.

Figure 3A:
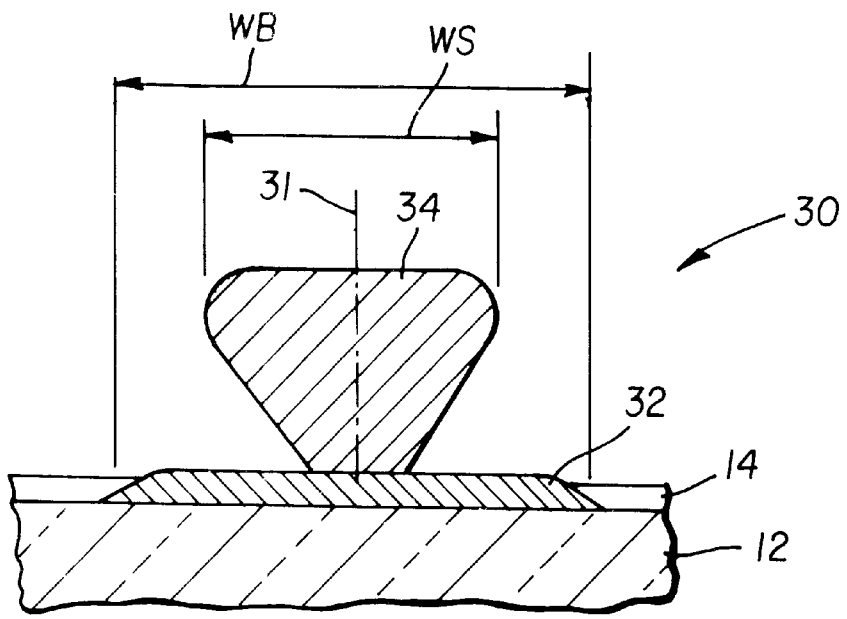
FIG. 3A is an enlarged section view of an organic cathode separation shadowing structure having a base and a shadowing structure over the base.

FIG. 3A is an enlarged section view of one of the cathode separation shadowing structures 30 which includes an electrically insulative organic base layer 32 and an electrically insulative organic shadowing structure 34 formed over the base layer 32 about a center line 31. A width dimension WB of the organic base layer 32 is larger than a width dimension WS of the organic shadowing structure 34.

Cathode separation shadowing structures in general have been used in fabricating conventional passive matrix organic EL devices (in the form of integral shadow masks) to provide electrical insulation between adjacent cathodes as disclosed, for example in U.S. Pats. 5,276,380 and 5,701,055, the disclosures of which are herein incorporated by reference. Organic shadowing structures shown in the drawings of the present application have been described in detail in U.S. patent application Ser. No. 09/372,963, filed Aug. 12, 1999, the disclosure of which is herein incorporated by reference.

Figure 4:
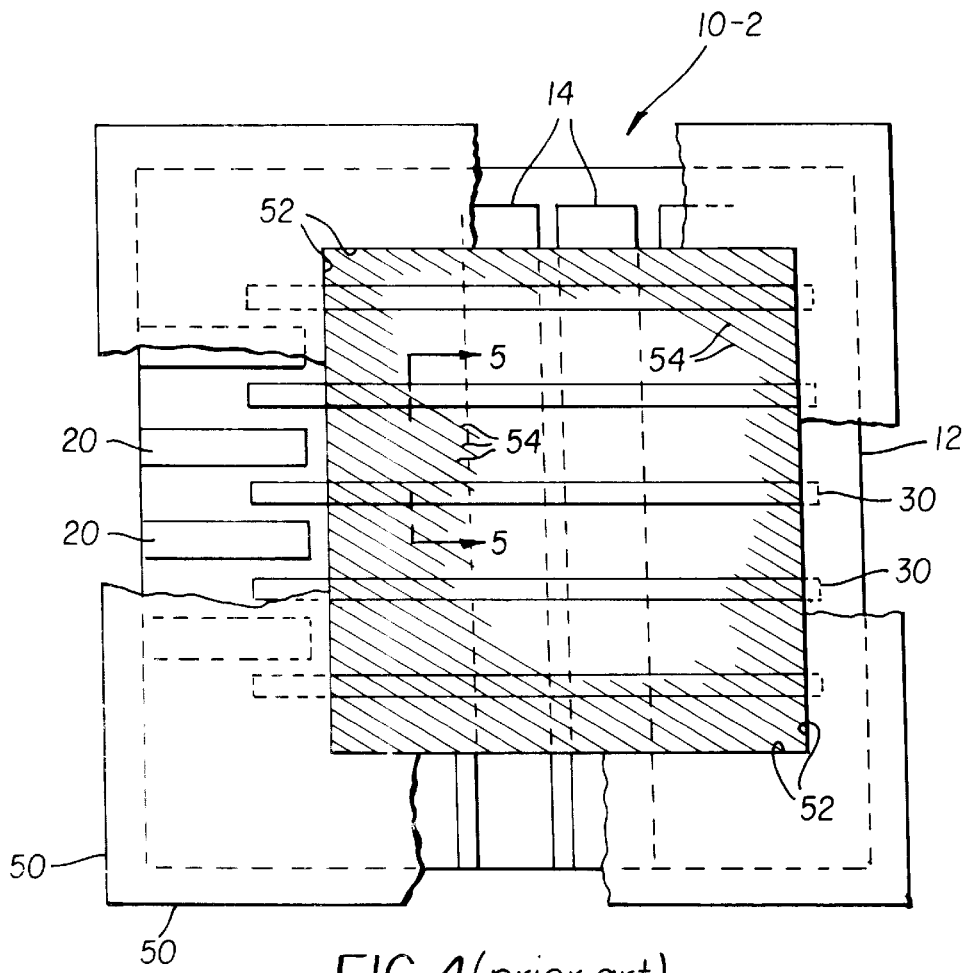

FIG. 4 is a plan view of a configuration 10-2 in which portions of the substrate 12 are covered by a first mask 50 which defines a first deposition zone 52. An organic EL medium layer 54 is formed over the substrate within the deposition zone 52 (for purposes of clarity of presentation, EL medium deposits formed over the mask 50 are not shown). The first mask 50 and its deposition zone 52 was accurately oriented with respect to the substrate 12 outside of an evacuated vapor deposition chamber, i.e. prior to forming the EL medium layer 54 by vapor deposition inside the vapor deposition chamber (not shown).

Figure 5:
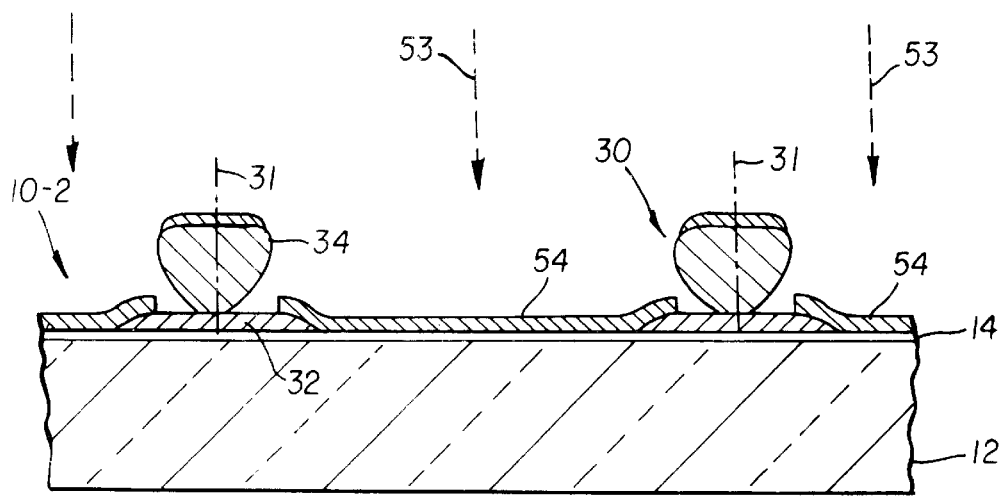

Turning to FIG. 5, there is shown an enlarged section view of the substrate 12 taken along the section line 5—5 of FIG. 4. Portions of the organic EL medium layer 54 are shown formed by vapor deposition from an organic EL materials vapor stream 53 which is directed towards the substrate 12 in the deposition zone 52 in a direction of vapor deposition substantially perpendicular to the substrate (or, alternatively, substantially parallel to the center lines 31 of the cathode separation shadowing structures 30).

Figure 6:
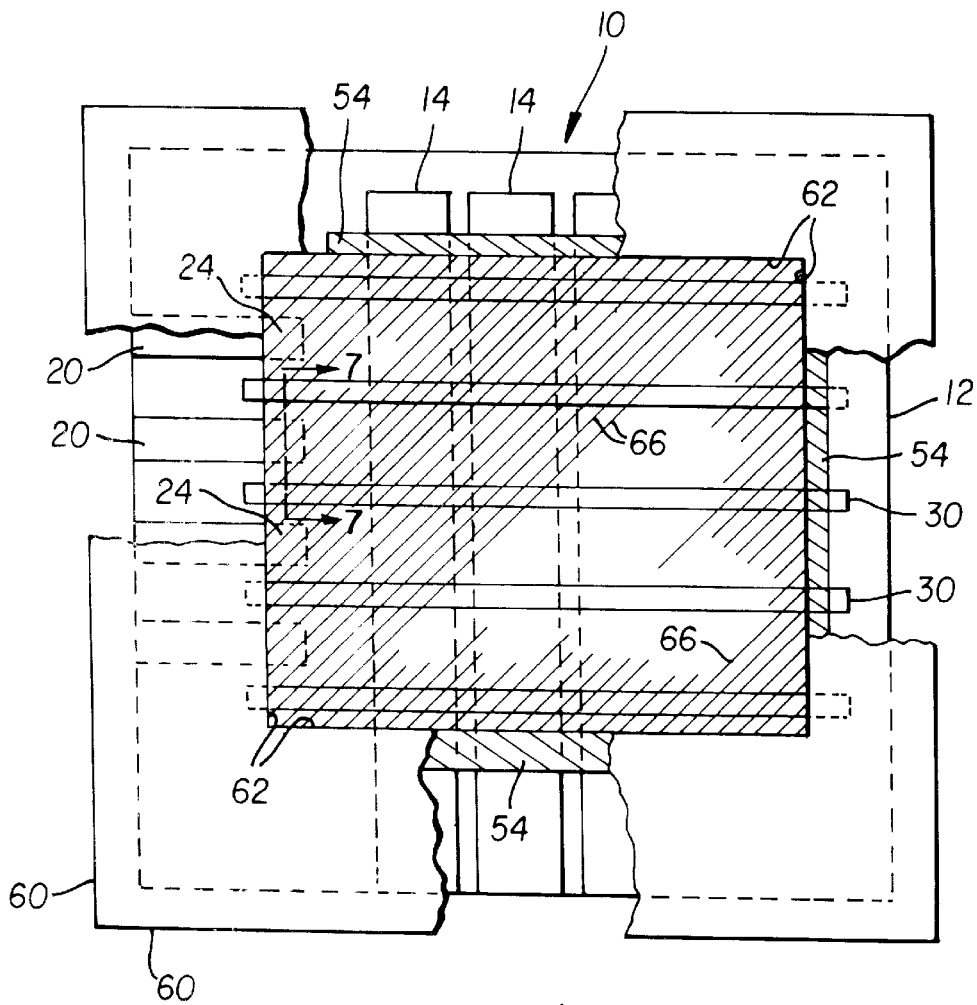

FIG. 6 is a plan view of an organic EL device 10 in which the substrate 12 has portions covered by a second mask 60 which defines a second deposition zone 62 for vapor depositing a conductive cathode 66 over the organic EL medium layer 54 and which is offset with respect thereto to provide contact regions 24 between the cathodes (separated from one another by the organic cathode separation shadowing structures 30) and the cathode connectors 20.

It will be appreciated that, prior to forming the cathode(s) 66, the first mask 50 (see FIG. 4) had to be separated from the substrate 12 inside the vacuum deposition chamber, and the second mask 60 had to be manipulated into a best-possible alignment with respect to the previously formed organic EL medium layer 54, also inside the deposition chamber.

Figure 7:
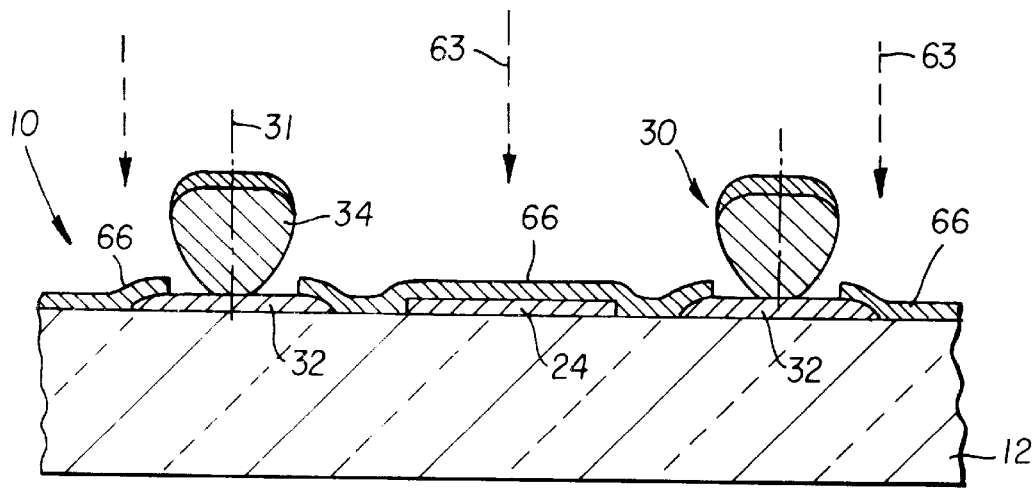

FIG. 7 is an enlarged section view taken along the section line 7—7 of FIG. 6 and showing a contact region 24 between a portion of a cathode connector 20 and the cathode 66. Adjacent cathodes 66 are spaced from one another by the cathode separation shadowing structures 30 as the cathodes 66 are formed from a cathode material vapor stream 63 which is directed toward the substrate into the deposition zone 62 in a direction substantially perpendicular to the substrate (or substantially parallel with the center lines 31 of the shadowing structures).

As shown in FIGS. 5 and 7, both the organic EL medium layer 54 and the cathode(s) 66 terminate on the base layer 32 at a position which is spaced from a base of the shadowing structures 34 due to the shadowing effect of such structures when the vapor streams 53 and 63 are directed at the substrate in the deposition zones 52 and 62 as indicated in FIGS. 5 and 7.

Upon removal of the mask 60 from the device 10 of FIG. 6, the passive matrix organic EL device 10 is operated by applying an electrical potential between a selected cathode via a cathode connector and a selected anode. When the selected cathode is biased negatively with respect to the selected anode, a selected pixel, $P_x$, $P_y$, will emit light through the light-transmissive anode 14 and the light-transmissive substrate 12.

FIGS. 8–16 indicate schematically process sequences for making a passive matrix pixelated organic electroluminescent device by using a single vapor deposition mask defining a deposition zone, and by incorporating cathode connector shadowing structures.

Figure 8:
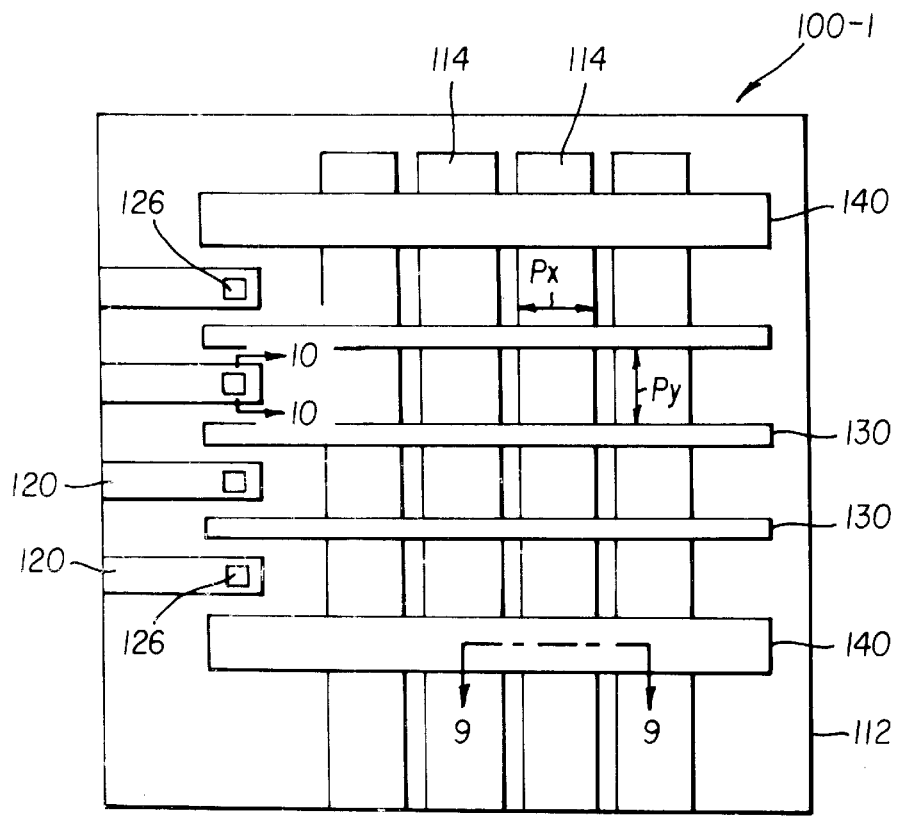

FIG. 8 is a plan view of a substrate configuration 100-1 before deposition of an organic EL medium layer. The light-transmissive substrate 112, the light-transmissive anodes 114, the cathode connectors 120, and the organic cathode separation shadowing structures 130 correspond to the substrate 12, the anodes 14, the cathode connectors 20, and the cathode separation shadowing structures 30 of the prior art configuration 10-1 of FIG. 1 and, therefore, require no further detailed description.

An organic cathode connector shadowing structure 126 is formed over each cathode connector 120, and two organic boundary layers 140 are provided over the anodes 114 and the substrate 112. The organic shadowing structures 126 and 130, as well as the organic boundary layers 140, are electrically insulative, and are formed by photolithographic process steps such as, for example, process steps disclosed in the aforementioned U.S. patent application Ser. No. 09/372,963, now U.S. Pat. No. 6,221,563.

Figure 9:
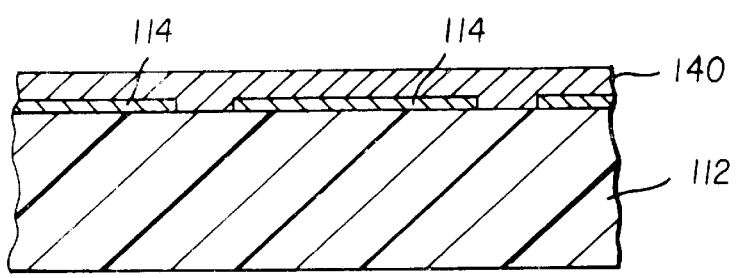

FIG. 9 is an enlarged section view taken along the section line 9—9 of FIG. 8 and showing the organic boundary layer 140 formed over the anodes 114.

Figure 10:
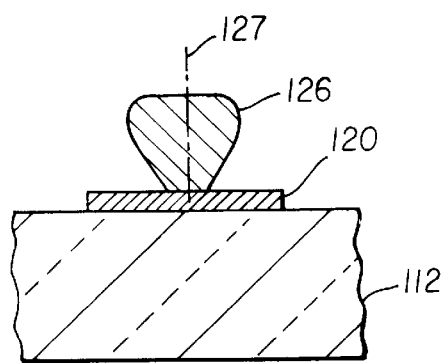

FIG. 10 is an enlarged section view of a cathode connector shadowing structure 126, taken along the section line 10—10 of FIG. 8. The cathode connector shadowing structure 126 is formed over the cathode connector 120, and has a center line 127. An anode 114 is shown in the background.

Figure 11:
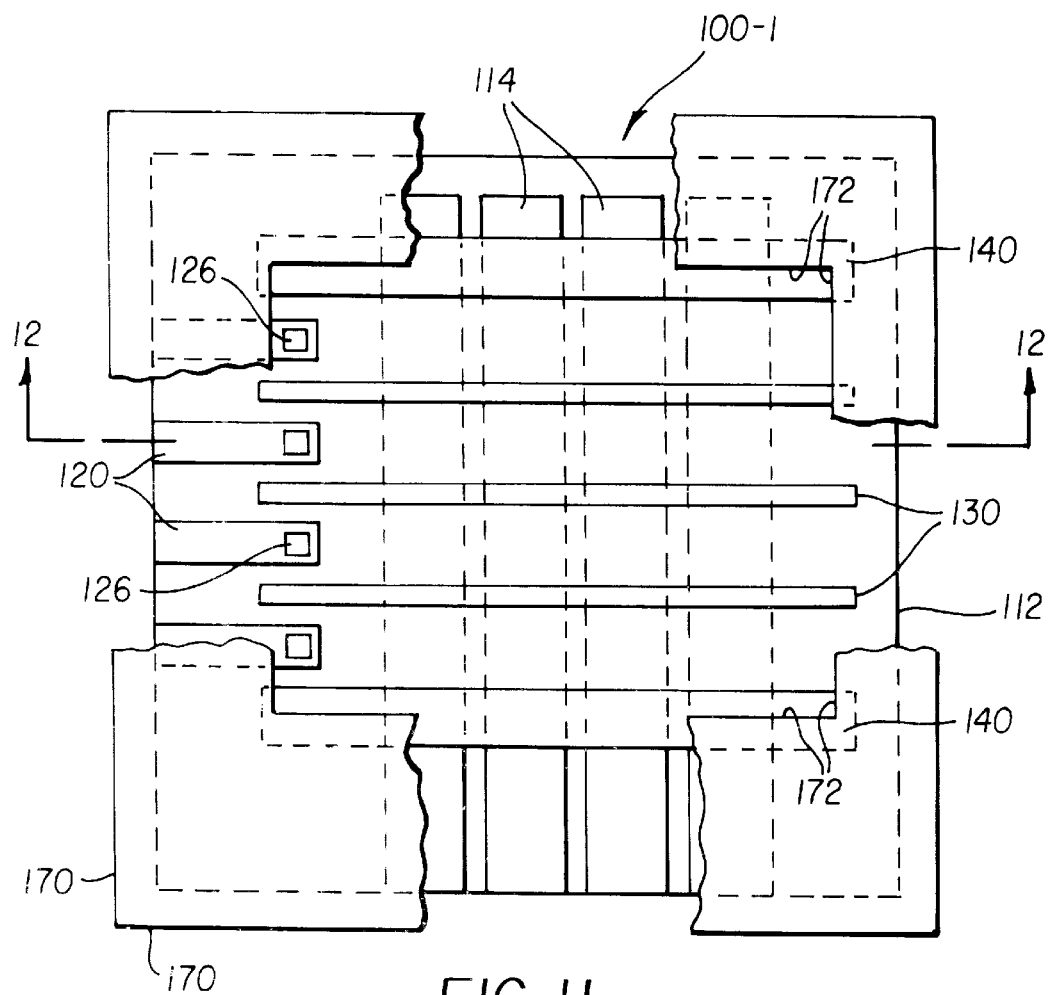

In FIG. 11, the substrate configuration 100-1 of FIG. 8 has portions covered by a mask 170 which defines a deposition zone 172 for subsequent formation of a vapor-deposited EL medium layer and of a cathode or of cathodes. The mask 170 and its deposition zone 172 are accurately oriented with respect to the substrate 112 outside a vapor deposition chamber, and this assembly is then transferred into such chamber. The deposition zone 172 includes portions of the cathode connectors 120 and the cathode connector shadowing structures 126, as well as portions of the organic boundary layers 140.

Figure 12:
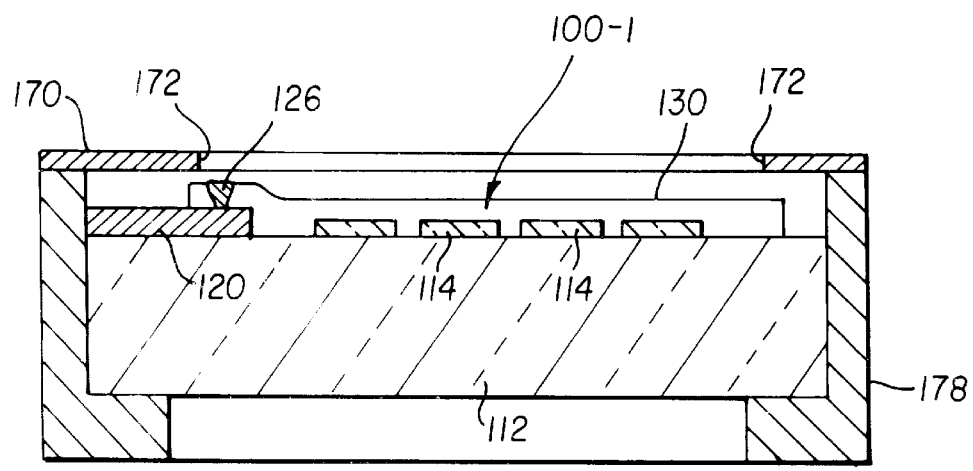

FIG. 12 is a section view taken along the section line 12—12 of FIG. 11 and showing a mask frame structure 178 which can slideably accept the substrate 112 of the configuration 100-1 and which supports the mask 170.

Figure 13:
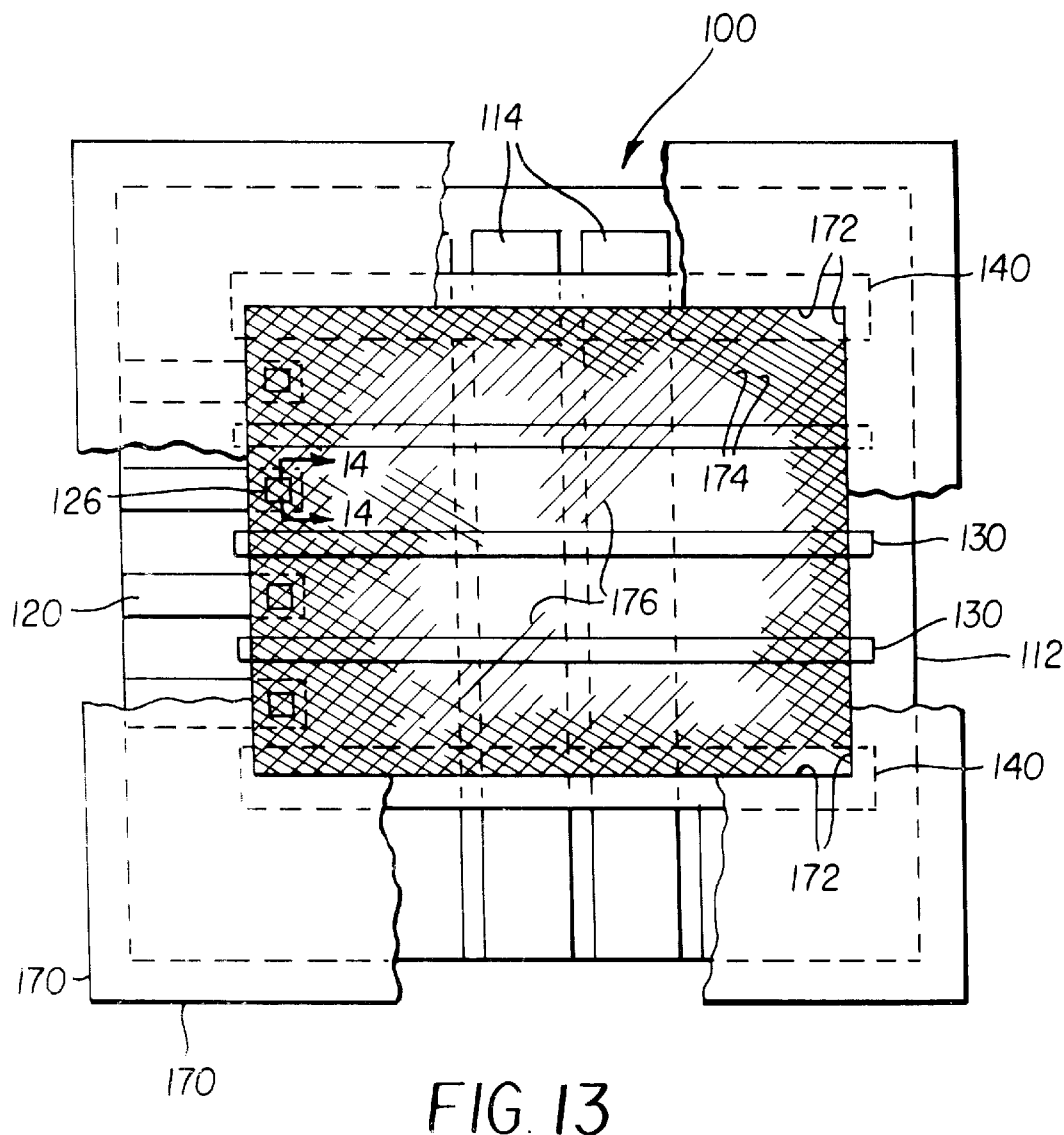

FIG. 13 is a plan view of a completed organic EL device 100, following formation of an organic EL medium layer 174 and of cathode(s) 176 by vapor deposition into the deposition zone 172. For clarity of presentation, deposits formed over the masked portions of the mask 170 have been omitted from the drawing.

Figure 14:
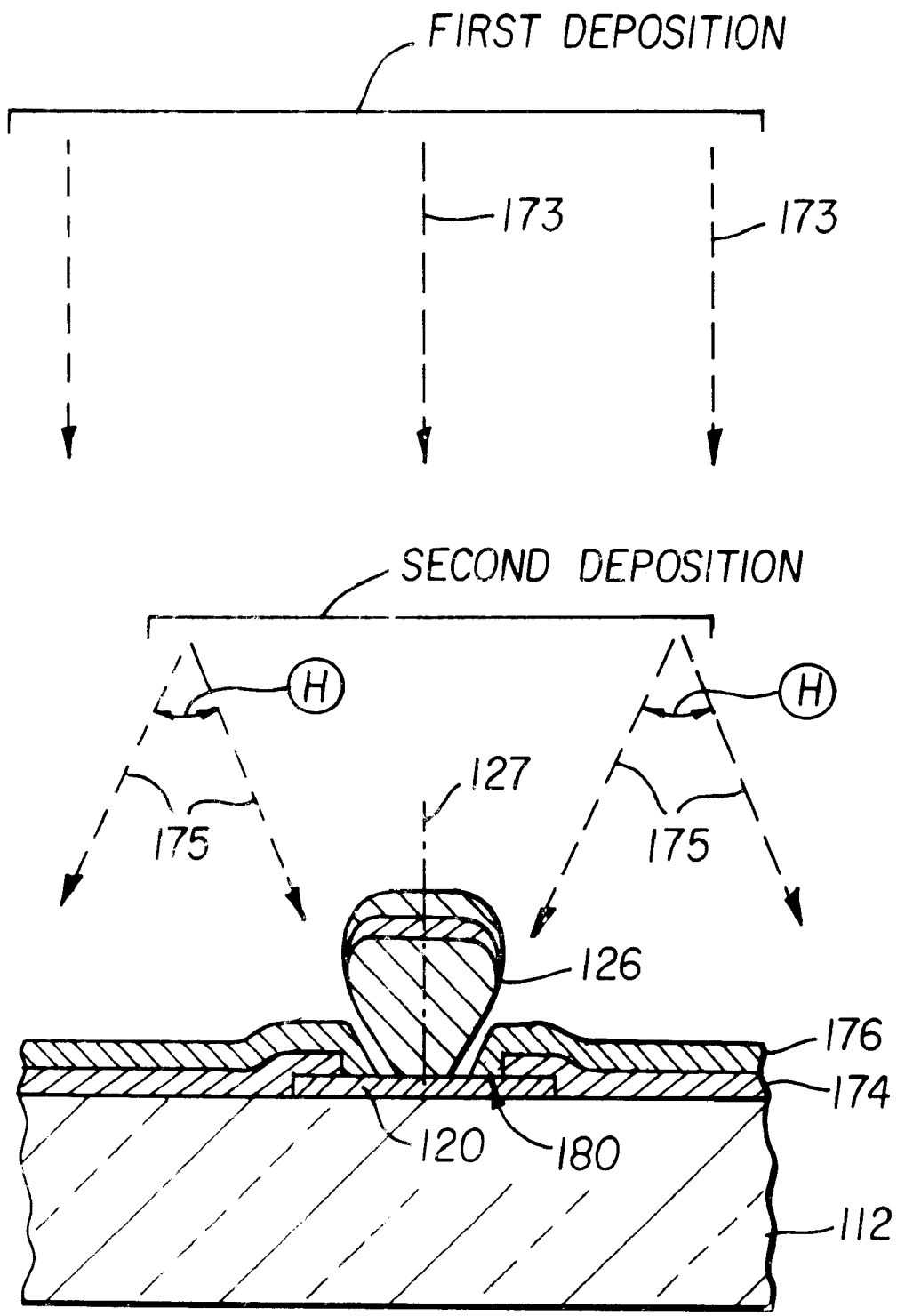

FIG. 14 is an enlarged section view of the organic cathode connector shadowing structure 126 taken along the section line 14—14 of FIG. 13.

In a first deposition, an organic EL materials vapor stream 173 is directed towards the substrate 112 into the deposition zone 172 (see FIG. 13) in a direction substantially perpendicular to the substrate (or substantially parallel to a center line 127 of the shadowing structure 126). This first deposition forms the organic EL medium layer 174 which terminates over the cathode connector 120 at a position which is spaced from a base of the cathode connector shadowing structure 126.

In a second deposition, a cathode materials vapor stream 175 is directed towards the organic EL medium layer 174 into the deposition zone 172. The cathode materials vapor stream 175 subtends an angle $\Theta$ with respect to the center line 127 of the shadowing structure 126. This second deposition forms the cathode(s) 176 and provides an electrical contact with the cathode connector 120 at contact region(s) 180 in a position where the organic EL medium layer 174 is spaced from the base of the cathode connector shadowing structure 126.

Thus, using a single mask which defines a deposition zone and which can be accurately oriented with respect to features on a substrate, and forming cathode connector shadowing structures, provides a simple, reliable and time-saving approach to manufacturing monochrome passive matrix organic EL devices.

Figure 15:
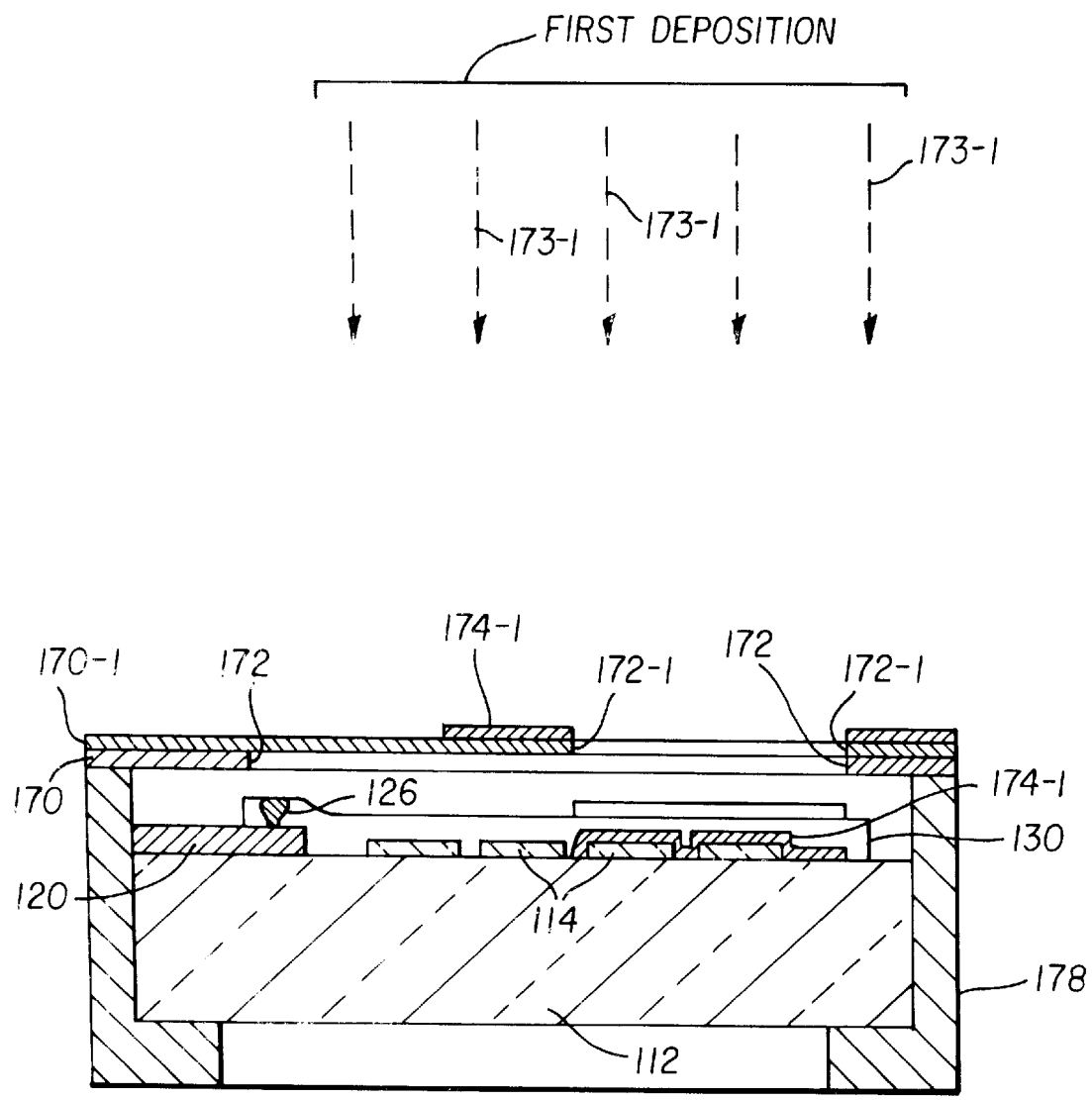

FIG. 15 is a section view similar to the section view of FIG. 12 and showing the mask 170 supported by the mask frame structure 178. An overlay mask 170-1 is positioned over the mask 170 to provide a deposition zone 172-1 which can be used, for example, to form an organic EL medium layer 174-1 over a portion of the substrate 112 in a first deposition from an organic EL materials vapor stream 173-1. The organic EL medium layer 174-1 can, for example, function to provide an area color or hue of light emission over an area covered by more than one pixel. The layer 174-1 is also formed over portions of the cathode separation shadowing structure 130 (which is apparent in the background of the section view) and over the masked portion of the overlay mask 170-1. The overlay mask 170-1 is then removed and replaced by a cover (not shown) which covers the EL medium layer 174-1 during formation of an organic EL medium layer providing a second color or hue over the remaining portions of the substrate and including the cathode connector shadowing structure 126 thorough the uncovered portion of the deposition zone 172 of the mask 170. Finally, the cover is removed and the cathode materials vapor stream 175 (see FIG. 14) is directed towards the organic EL medium layers (which form the area colors) to provide a cathode and the contact region 180 of FIG. 14.

Figure 16A:
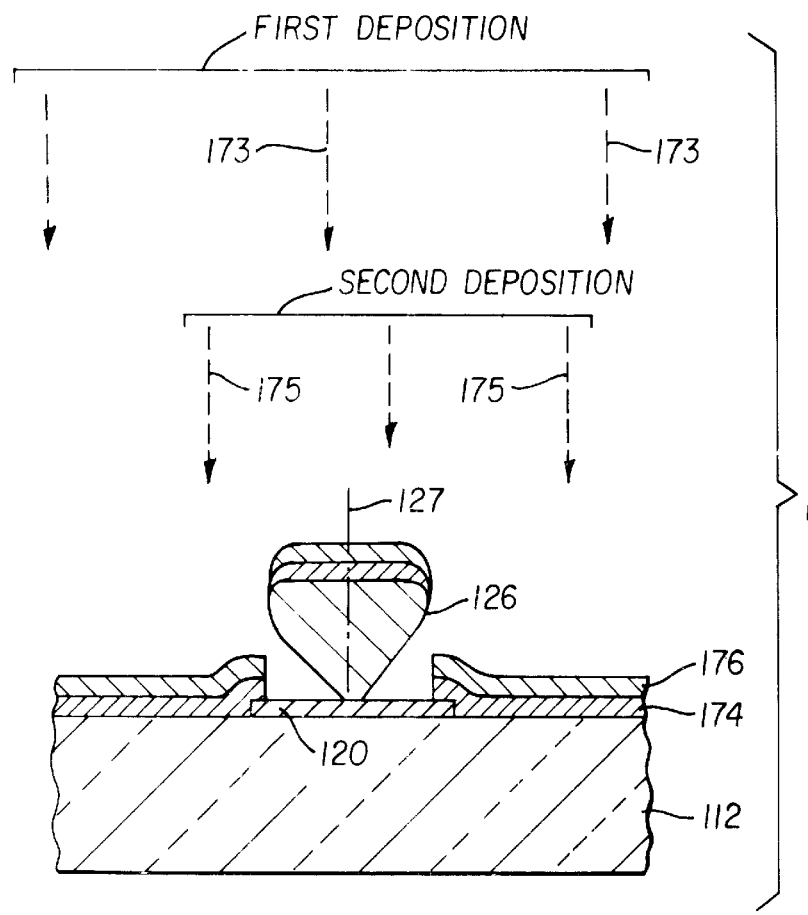
FIG. 16A is an enlarged section view of cathode connector shadowing structure formed over a cathode connector and showing first (organic EL) and second (cathode) vapor depositions incident in a direction perpendicular to the substrate to form an organic EL medium layer and a cathode thereover.
Figure 16B:
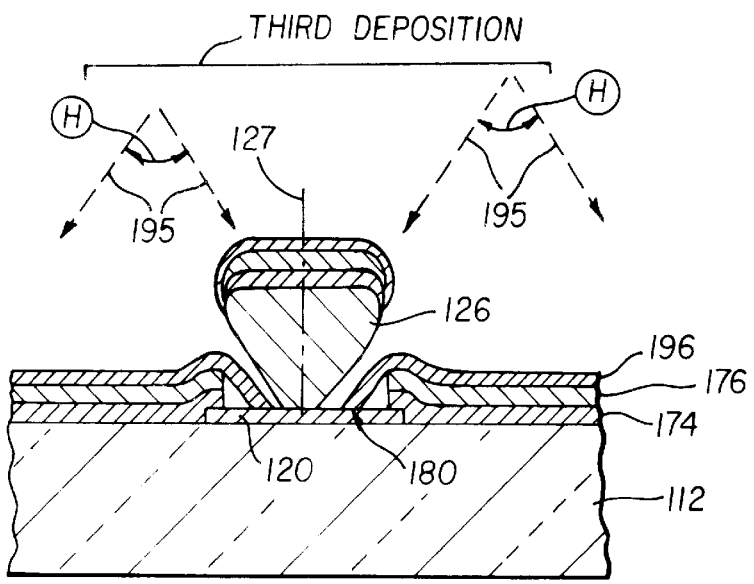
FIG. 16B depicts the section view of FIG. 16A and showing a third supplemental metal vapor deposition to form a supplemental metal layer over the cathode and in electrical contact with the cathode connector.

FIGS. 16A and 16B are section views similar to the view of FIG. 14, showing the cathode connector shadowing structure 126 and its function with respect to first, second, and third depositions.

In FIG. 16A, an organic EL medium layer 174 is formed over the substrate 112 by a first deposition from an organic EL materials vapor stream 173 as described previously with reference to FIG. 14. A cathode 176 is formed over the EL medium layer 174 by directing a cathode materials vapor stream 175 into the deposition zone 172 (see FIG. 13) in a direction substantially perpendicular to the substrate (or substantially parallel with a center line 127 of the shadowing structure 126). Thus, both the layer 174 and the cathode 176 extend over portions of the cathode connector 120, but are spaced from a base of the cathode connector shadowing structure 126.

In FIG. 16B, a supplemental conductive layer 196 is formed over the cathode 176 by directing a supplemental conductive materials vapor stream 195 towards the cathode 176, where the vapor stream 195 subtends an angle $\Theta$ with respect to the center line(s) 127.

The supplemental conductive layer 196 provides electrical contact to the cathode conductor 120 at contact regions 180 in a position where the organic EL medium layer 174 and the cathode 176 are spaced from a base of the shadowing structure 126.

The process depicted in FIGS. 16A and 16B is used advantageously when a cathode 176 benefits from, or calls for, a supplemental conductive layer which can provide protection for the cathode or which can enhance environmental stability of the cathode.

FIGS. 17–20 show schematically aspects of making an active matrix organic EL device by using a single mask which defines a deposition zone for depositing an organic EL medium layer and a common cathode which is in electrical contact with a cathode connector.

Figure 17:
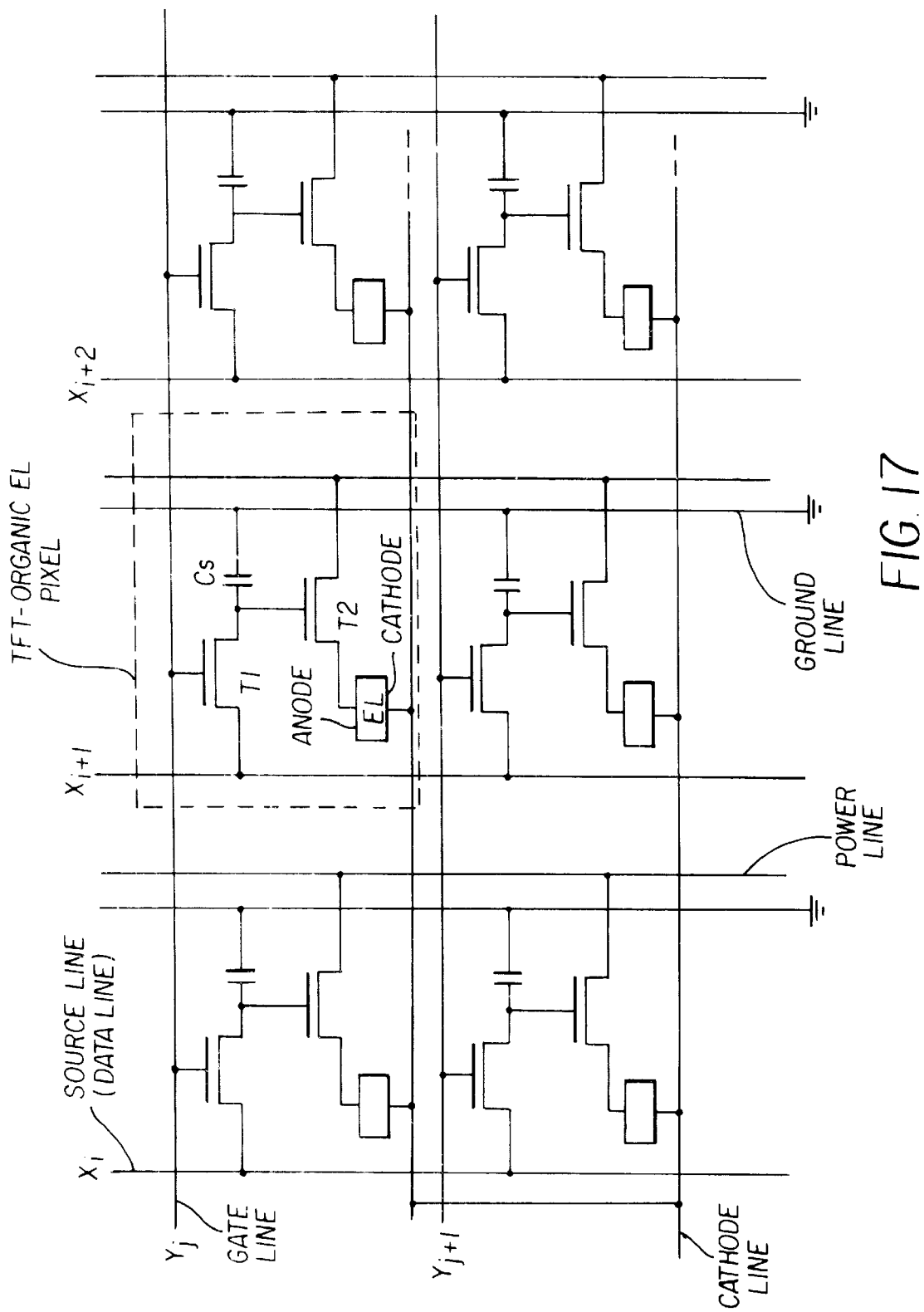

FIG. 17 is a schematic circuit diagram showing a plurality of addressable thin-film-transistor (TFT) organic EL pixels. Each TFT-organic EL pixel includes a logic transistor T1, a capacitor $C_s$, and a power transistor T2 which can cause light emission from an EL medium sandwiched between a light-transmissive anode and a cathode. The logic transistor T1 can be actuated by providing appropriate signals at a gate line and a source line. A cathode line is shown in bold outline to denote a common cathode for all pixels of the device. The construction and function of an active matrix electroluminescent device is disclosed in U.S. Pat. 5,550,066, the disclosure of which is herein incorporated by reference.

Figure 18:
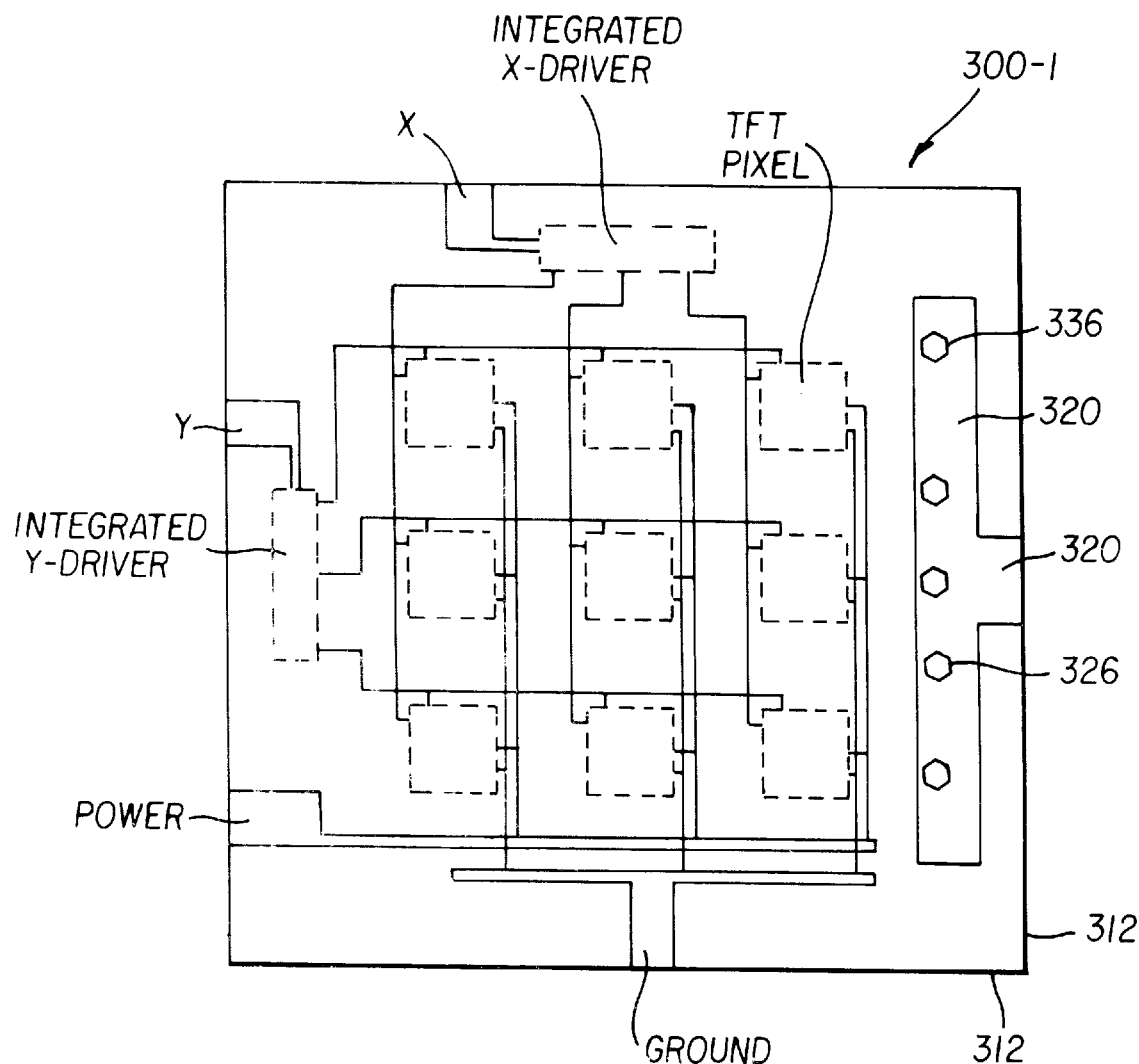

FIG. 18 is a plan view of a substrate configuration 300-1 in which a plurality of TFT pixels are provided on a light-transmissive substrate 312. Integrated driver circuits for addressing the logic transistors T1 of the pixels can be provided along peripheral areas of the substrate 312.

A cathode connector 320 is formed over the substrate 312, and organic cathode connector shadowing structures 336 are formed over the cathode connector 320.

Figure 19:
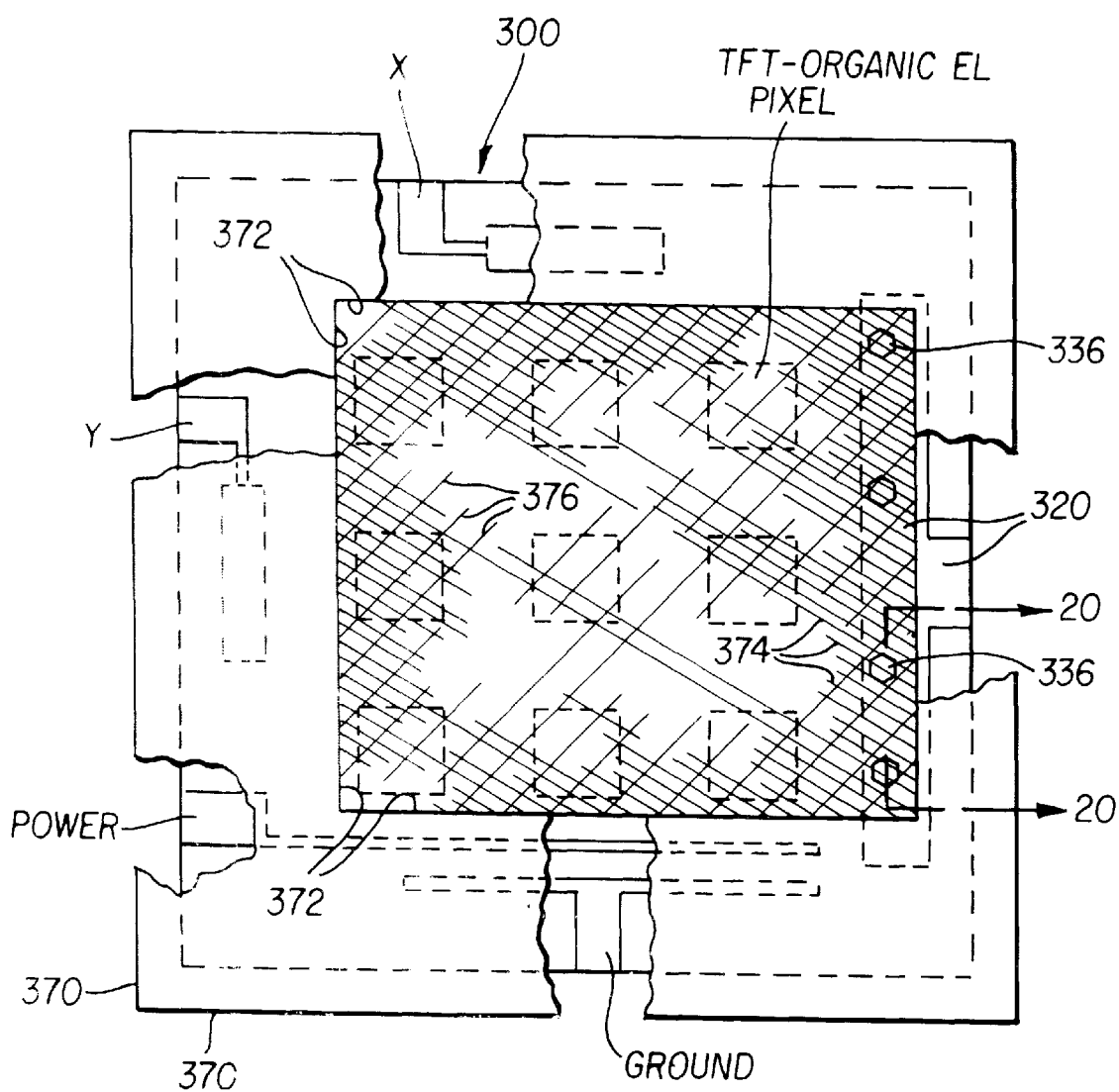

FIG. 19 is a plan view of an active matrix organic EL device 300 and showing an organic EL medium layer 374 formed over the substrate, and a cathode 376 formed over the layer 374 within a deposition zone 372 defined in a mask 370. The deposition zone 372 includes the cathode connector shadowing structures 336 and a portion of the cathode connector 320.

Figure 20:
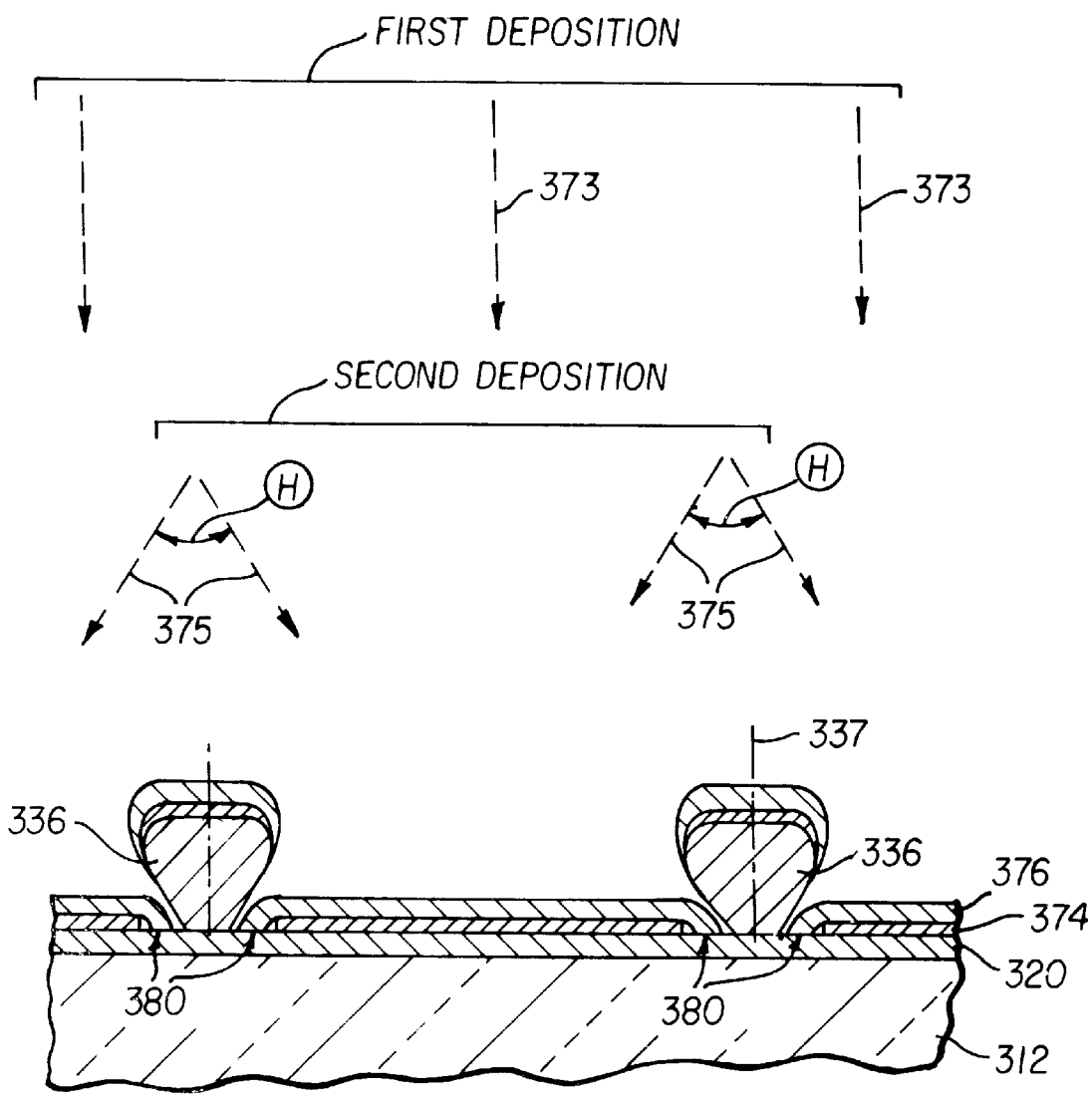

FIG. 20 is an enlarged section view taken along the section lines 20—20 of FIG. 19, and showing two cathode connector shadowing structures 336. In a first deposition, the organic EL medium layer 374 is formed over the substrate and over the cathode connector 320 by an organic EL materials vapor stream 373 which is directed towards the substrate 312 through the deposition zone 372 (see FIG. 19) in a direction substantially perpendicular to the substrate 312 (or substantially parallel to a center line 337 of the shadowing structure 336). The cathode 376 is formed over the organic EL medium layer 374 by directing a cathode materials vapor stream 375 towards the layer 374, where the vapor stream 375 subtends an angle $\Theta$ with respect to the center line 337. Thus, electrical contact is provided between the cathode 376 and the cathode connector 320 at contact regions 380 in a position where the organic EL medium layer 374 is spaced from a base of the cathode connector shadowing structure 336.

It will be appreciated that the cathode connector shadowing structures in accordance with the present invention can be circular or polygonal when observed in a plan view. In particular, the shadowing structures 336 of FIGS. 18 and 19 can be elongated so as to constitute a single cathode connector shadowing structure 336.

The invention has been described in detail with particular reference to certain preferred embodiments thereof, but it will be understood that variations and modifications can be effected within the spirit and scope of the invention.

PARTS LIST

Parts 10–66 relate to a prior art device
10 organic electroluminescent (EL) device
10-1 configuration before organic EL medium deposition
10-2 configuration after organic EL medium deposition
12 light-transmissive substrate
14 light-transmissive anode(s)
20 cathode connector(s)
24 contact region (between cathode and cathode connector)
30 organic cathode separation shadowing structure(s)
31 center line(s)
32 organic base layer(s)
34 organic shadowing structure(s)
50 mask (for organic EL medium deposition)
52 deposition zone (for organic EL medium deposition)
53 organic EL materials vapor stream
54 organic EL medium layer
60 mask (for cathode deposition)
62 deposition zone (for cathode deposition)
63 cathode materials vapor stream
66 cathode(s)
100 organic electroluminescent (EL) device
100-1 configuration before organic EL medium deposition
112 light-transmissive substrate
114 light-transmissive anode(s)
120 cathode connector(s)
126 organic cathode connector shadowing structure(s)
127 center line(s)
130 organic cathode separation shadowing structure(s)
140 organic boundary layer(s)

PARTS LIST 170 mask (for organic EL medium and for cathode deposition)
170-1 overlay mask (for selected-area organic EL medium deposition)
172 deposition zone
172-1 overlay deposition zone
173 organic EL materials vapor stream
173-1 organic EL materials vapor stream (overlay mask)
174 organic EL medium layer
174-1 selected area organic EL medium layer
175 cathode materials vapor stream
176 cathode(s)
178 mask frame structure
180 contact region (between cathode and cathode connector)
195 supplemental conductive materials vapor stream
196 supplemental conductive layer
300 active-matrix organic electroluminescent (EL) device
300-1 configuration before organic EL medium deposition
312 light-transmissive substrate
320 cathode connector
336 organic cathode connector shadowing structure(s)
337 center line(s)
370 mask (for organic EL medium and for cathode deposition)
372 deposition zone
373 organic EL materials vapor stream
374 organic EL medium layer
375 cathode materials vapor stream
376 common cathode
380 contact region(s) (between cathode and cathode connector)

PARTS LIST

Px active pixel dimension in x-direction
Py active pixel dimension in y-direction
$\Theta$ angle (subtended by conductive materials vapor stream)
WB width dimension of organic base layer
WS width dimension of organic shadowing structure(s)

What is claimed is:

1. A method of making a pixelated organic electroluminescent (EL) device, comprising the steps of:

a) providing a light-transmissive substrate having a plurality of spaced light-transmissive anodes formed thereover and at least one cathode connector extending inwardly from an edge of the substrate for providing an electrical connection so that a drive voltage can be applied between a selected anode and at least one cathode to cause light emission from a pixel of the device formed by the selected anode and the at least one cathode;

b) forming an electrically insulative organic cathode connector shadowing structure over the at least one cathode connector;

c) providing a mask defining a deposition zone over the substrate for depositing an electrically insulative organic EL medium layer and a conductive cathode over the organic EL medium layer;

d) first depositing the organic EL medium layer by a vapor deposition of organic EL materials directed towards the substrate into the deposition zone and using a direction of vapor deposition with respect to the cathode connector shadowing structure to cause formation of the organic EL medium layer to terminate at a position spaced from a base of the at least one cathode connector shadowing structure; and e) second depositing the conductive cathode by a vapor deposition of conductive materials directed towards the organic EL medium layer into the deposition zone and using a direction of vapor deposition with respect to the cathode connector shadowing structure to cause formation of the conductive cathode over the organic EL medium layer, the conductive cathode terminating in electrical contact with the at least one cathode connector in a position where the organic EL medium layer is spaced from the base of the at least one cathode connector shadowing structure.

2. The method of claim 1 wherein the mask is provided as part of a frame structure for accurately positioning the mask with respect to the substrate.

3. The method of claim 1 wherein the direction of vapor deposition of the organic EL materials is substantially perpendicular to a surface of the substrate.

4. The method of claim 3 wherein the direction of vapor deposition of the conductive materials subtends an angle Θ with respect to a center line of the cathode connector shadowing structure to cause the conductive cathode to terminate in electrical contact with the cathode connector at a position closer to the base of the cathode connector shadowing structure than the position of the organic EL medium layer.

5. The method of claim 1 wherein the conductive cathode terminates in electrical contact with each of a plurality of spaced cathode connectors and forming a plurality of spaced organic cathode separation shadowing structures over the anodes and the substrate which extend in a direction perpendicular to the anode to provide a plurality of spaced cathodes.

6. The method of claim 5 wherein each of the spaced organic cathode separation shadowing structures includes an electrically insulative organic base layer and an electrically insulative organic cathode separation shadowing structure formed over the base layer.

7. The method of claim 6 wherein a width dimension WB of the organic base layer is larger than a width dimension WS of the organic shadowing structure.

8. A pixelated organic electroluminescent (EL) device made by the method of claim 5.

9. The method of claim 1 wherein the mask providing step c) further includes the step of:
provinding an overlay mask over the mask, the overlay mask defining an overlay deposition zone over the substrate which is smaller than the defined deposition zone of the mask for depositing a first electrically insulative organic EL medium layer over a first portion of the substrate.

10. The method of claim 9 wherein the depositing steps d) and e) further include the steps of:
i) first depositing the first organic EL medium layer over the first portion of the substrate by a vapor deposition of first organic EL materials directed towards the substrate into the overlay deposition zone;
ii) removing the overlay mask and shielding the first organic EL medium layer from further organic EL medium deposition;
iii) second depositing a second organic EL medium layer over a remaining unshielded portion of the substrate by a vapor deposition of second organic EL materials directed towards the substrate into the deposition zone of the mask;
iv) removing the shielding over the first organic EL medium layer; and
v) third depositing the conductive cathode by the vapor deposition of conductive materials directed towards the first and second organic EL medium layers into the deposition zone.

11. The method of claim 1 wherein the conductive cathode depositing step e) further includes the steps of:
i) depositing the conductive cathode by the vapor deposition of conductive cathode materials directed towards the organic EL medium layer into the deposition zone and using of vapor deposition with respect to the cathode connector shadowing structure to cause formation of the conductive cathode to terminate at a position spaced from the base of the at least one cathode connector shadowing structure; and
ii) depositing a supplemental conductive layer by a vapor deposition of supplemental conductive materials directed towards the cathode into the deposition zone and using a direction of vapor deposition with respect to the cathode connector shadowing structure to cause formation of the supplemental conductive layer over the cathode, the supplemental conductive layer terminating in electrical contact with the at least one cathode connector in a position where the organic EL medium layer and the cathode are spaced from the base of the at least one cathode connector shadowing structure.

12. A method of making a pixelated active matrix organic electroluminescent (EL) device, comprising the steps of:
a) providing a light-transmissive substrate having a plurality of spaced thin-film transistor (TFT) circuits formed thereover and a light-transmissive anode electrically connected to each of the TFT circuits, and one cathode connector extending inwardly from an edge of the substrate for providing an electrical connection so that a drive voltage can be applied between an anode of a selected TFT circuit and a common cathode to cause light emission from a pixel of the device formed by the selected TFT circuit;
b) forming at least one electrically insulative organic cathode connector shadowing structure over the cathode connector;
c) providing a mask defining a deposition zone over the substrate for depositing an electrically insulative organic EL medium layer and a conductive cathode over the organic EL medium layer;
d) first depositing the organic EL medium layer by a vapor deposition of organic EL materials directed towards the substrate into the deposition zone and using a direction of vapor deposition with respect to the at least one cathode connector shadowing structure to cause formation of the organic EL medium layer to terminate at a position spaced from a base of the at least one cathode connector shadowing structure; and
e) second depositing the conductive cathode by a vapor deposition of conductive materials directed towards the organic EL medium layer into the deposition zone and using a direction of vapor deposition with respect to the at least one cathode connector shadowing structure to cause formation of the conductive cathode over the organic EL medium layer, the conductive cathode terminating in electrical contact with the cathode connector in a position where the organic EL medium layer is spaced from the base of the at least one cathode connector shadowing structure.

13. The method of claim 12 wherein the mask is provided as part of a frame structure for accurately positioning the mask with respect to the substrate.

14. The method of 12 wherein the direction of vapor deposition of the organic EL materials is substantially perpendicular to a surface of the substrate.

15. The method of claim 14 wherein the direction of vapor deposition of the conductive materials subtends an angle $\Theta$ with respect to a center line of the cathode connector shadowing structure to cause the conductive cathode to terminate in electrical contact with the cathode connector at a position closer to the base of the cathode connector shadowing structure than the position of the organic EL medium layer.

16. The method of claim 12 wherein a plurality of spaced electrically insulative organic cathode connector shadowing structures are formed over the cathode connector.

17. The method of claim 1 wherein step b) further includes forming the cathode connector shadowing structure having a circular or polygonal shape as observed in a plan view.

18. The method of claim 12 wherein step b) further includes forming the at least one cathode connector shadowing structure having a circular, a polygonal, or an elongated shape as observed in a plan view.

19. A pixelated active matrix organic electroluminescent (EL) device made by the method of claim 18.

* * * * *